United States Patent [19]

El-Diwany et al.

[11] Patent Number: 5,082,796

[45] Date of Patent: Jan. 21, 1992

[54] USE OF POLYSILICON LAYER FOR LOCAL INTERCONNECT IN A CMOS OR BICMOS TECHNOLOGY INCORPORATING SIDEWALL SPACERS

[75] Inventors: Monir H. El-Diwany, Santa Clara; Michael P. Brassington; Reda R. Razouk, both of Sunnyvale, all of Calif.

[73] Assignee: National Semiconductor Corporation, Santa Clara, Calif.

[21] Appl. No.: 557,264

[22] Filed: Jul. 24, 1990

[51] Int. Cl.[5] .................. H01L 21/265; H01L 21/225
[52] U.S. Cl. ........................................ 437/44; 437/35; 437/56; 437/59
[58] Field of Search .................. 437/44, 191, 162, 56, 437/35, 34, 59; 148/DIG. 19

[56] References Cited

U.S. PATENT DOCUMENTS

| | | | |
|---|---|---|---|
| 4,016,594 | 4/1977 | Shappir | 357/41 |
| 4,120,707 | 10/1978 | Beasom | 357/41 |
| 4,151,631 | 5/1979 | Klein | 357/41 |
| 4,280,271 | 7/1981 | Lou et al. | 357/41 |
| 4,287,661 | 9/1981 | Stoffel | 357/59 |
| 4,319,932 | 3/1982 | Jambotkar | 357/59 |
| 4,341,009 | 7/1982 | Bartholomew et al. | 437/191 |
| 4,346,512 | 8/1982 | Liang et al. | 437/56 |
| 4,497,106 | 2/1985 | Momma et al. | 437/162 |
| 4,503,603 | 3/1985 | Blossfeld | 357/43 |
| 4,613,886 | 9/1986 | Chwang | 357/42 |
| 4,658,496 | 4/1987 | Beinvogl et al. | 437/56 |
| 4,677,735 | 7/1987 | Malhi | 437/34 |
| 4,701,423 | 10/1987 | Szluk | 437/44 |
| 4,717,686 | 1/1988 | Jacobs et al. | 437/56 |
| 4,727,046 | 2/1988 | Tuntasood et al. | 437/31 |
| 4,735,911 | 4/1988 | Schaber | 437/57 |
| 4,737,472 | 4/1988 | Schaber et al. | 437/191 |
| 4,745,080 | 5/1988 | Scovell et al. | 437/31 |
| 4,746,219 | 5/1988 | Holloway et al. | 357/23.11 |
| 4,752,589 | 6/1988 | Schaber | 437/44 |
| 4,764,482 | 8/1988 | Hsu | 437/57 |
| 4,821,085 | 4/1989 | Haken et al. | 357/42 |

FOREIGN PATENT DOCUMENTS 56-164578 12/1981 Japan.
0113474 5/1987 Japan ............................ 437/35

OTHER PUBLICATIONS

"Buried Contact Process," R. L. Mohler, et al., *IBM Technical Disclosure Bulletin*, vol. 26, No. 7B (Dec. 1983).

(List continued on next page.)

Primary Examiner—Brian E. Hearn
Assistant Examiner—C. Chaudhari
Attorney, Agent, or Firm—Townsend and Townsend

[57] ABSTRACT

A method of constructing a semiconductor structure wherein the polysilicon gate layer in a CMOS or BiCMOS structure incorporating LDD structures may be used for local interconnect. In one embodiment of the invention directed to a BiCMOS process, a silicon substrate is divided into bipolar and MOS regions. A thin layer of gate oxide then is thermally grown on the silicon substrate. A thin layer of polysilicon is deposited on the gate oxide layer to protect the gate oxide layer during subsequent processing, and then both the thin polysilicon layer and the gate oxide layer are etched from the bipolar and MOS regions where the respective emitter and gates are to be formed and where buried contacts are to be made. A thick layer of polysilicon then is deposited on the bipolar and MOS regions of the silicon substrate, and the substrate is masked and etched for defining the bipolar emitter, the MOS gates, and the local interconnects. A conformal silicon dioxide layer is subsequently deposited and etched for forming oxide spacers on the sidewalls of the polysilicon layer. By selectively doping the polysilicon layer and exposed portions of the substrate, a continuous active region is formed beneath the polysilicon layer and the sidewall spacers.

38 Claims, 6 Drawing Sheets

OTHER PUBLICATIONS

"Use of Polysilicon Gate Layer for Local Interconnect in a CMOS Technology Incorporating LDD Structures," M. H. El-Diwany, et al., *IEEE Transactions on Electron Devices*, vol. 35, No. 9, (Sep. 1988).

V. Leo Rideout, et al. MOSFET's with Polysilicon Gates Self-Aligned to the Field Isolation and to the Source and Drain Regions, pp. 1047–1052, IEEE Transactions on Electron Devices, vol. ED-26, No. 7, Jul. 1979, 1979 IEEE.

H. S. Fu, J. Manoliu, et al., A New MOS Transistor Design with Self-Registering Source-Drain and Gate Contacts, pp. 140–143, 1980 IEEE.

N. Tamba, et al., Session XIII: Static RAMs, THPM 13.6: An 8ns 255K BiCMOS RAM, 1988 IEEE International Solid-State Circuits Conference.

M. Vora, et al., A 2 Micron High Performance Bipolar 64K ECL Static RAM Technology with 200 Square Microns Contactless Memory Cell, pp. 690–693, 1984 IEDM.

Y. Tamaki, et al., New Self-Aligned Bipolar Device Process Technology for Sub-50ps ECL Circuits, pp. 22–23, 1987 IEEE.

M. P. Brassington et al., An Advanced Submicron BiCMOS Technology for VLSI Applications, pp. 89–90.

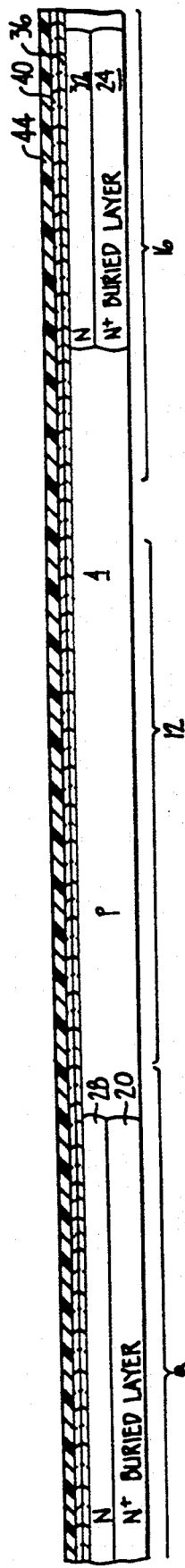
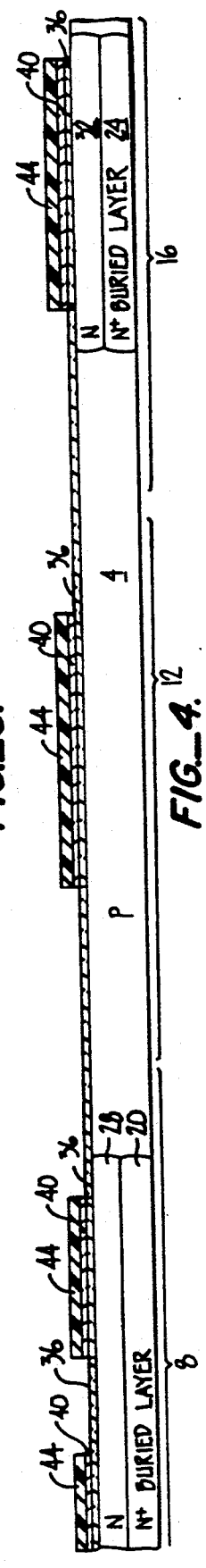
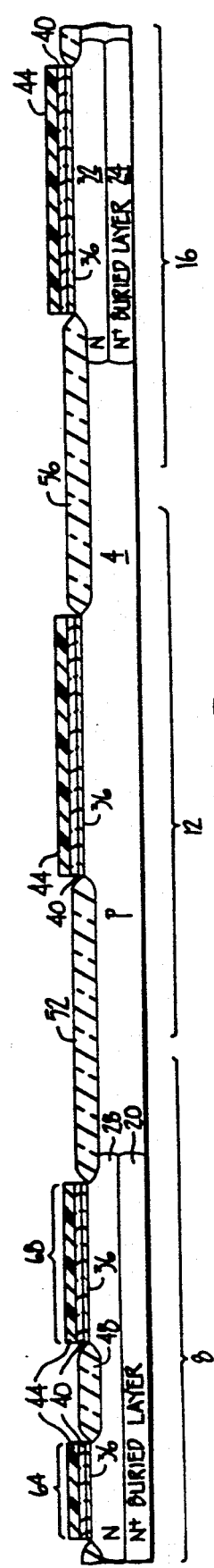
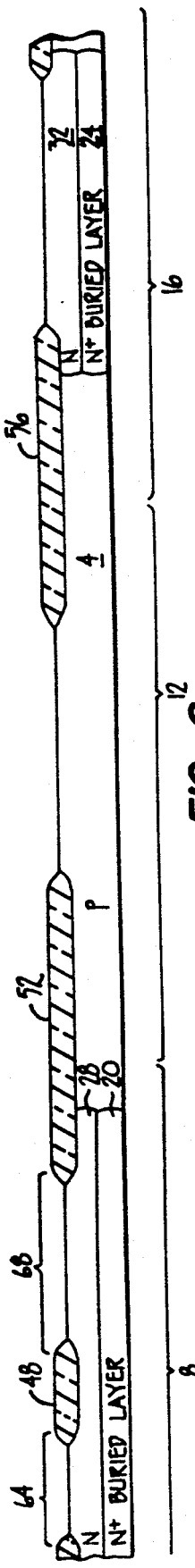

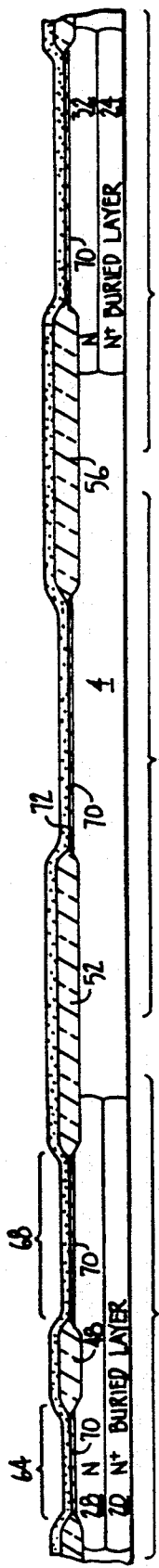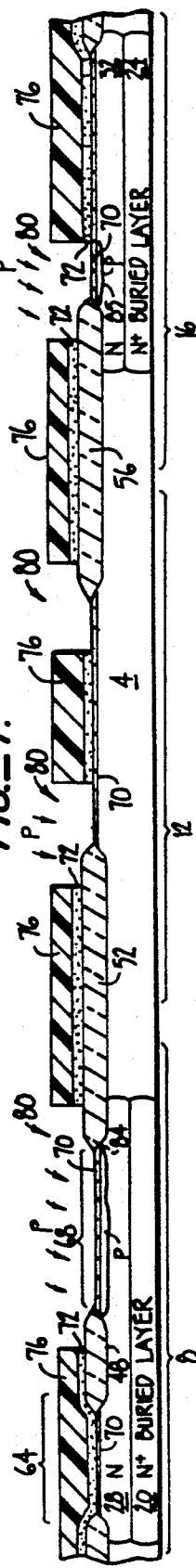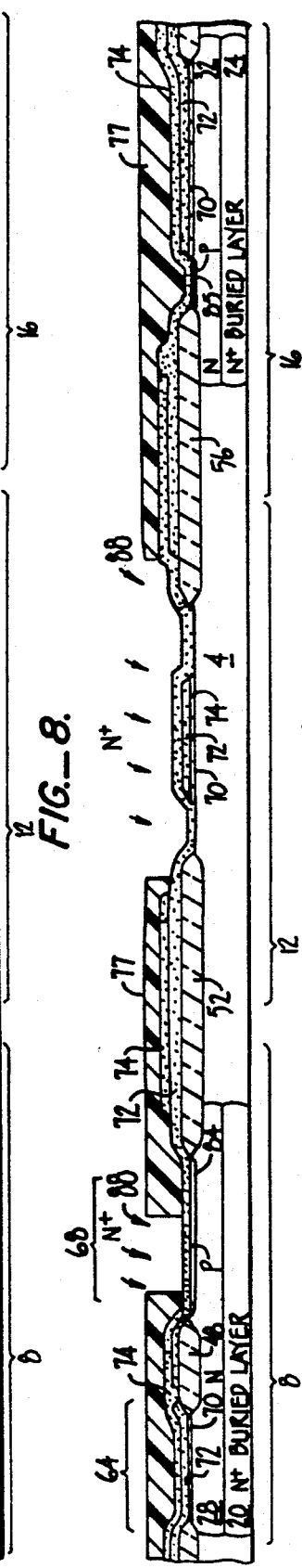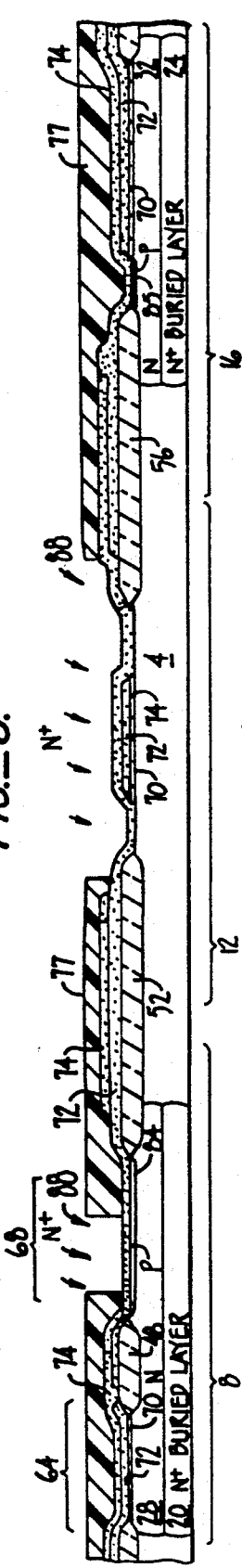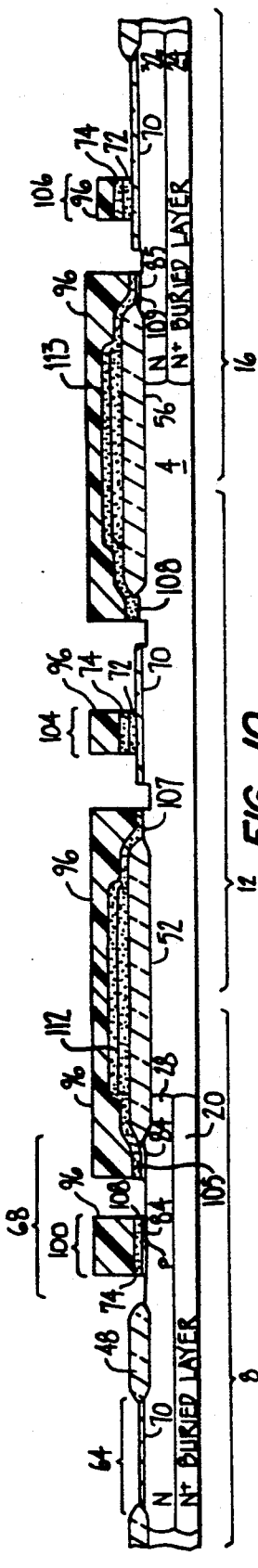
FIG._7. FIG._8. FIG._9. FIG._10.

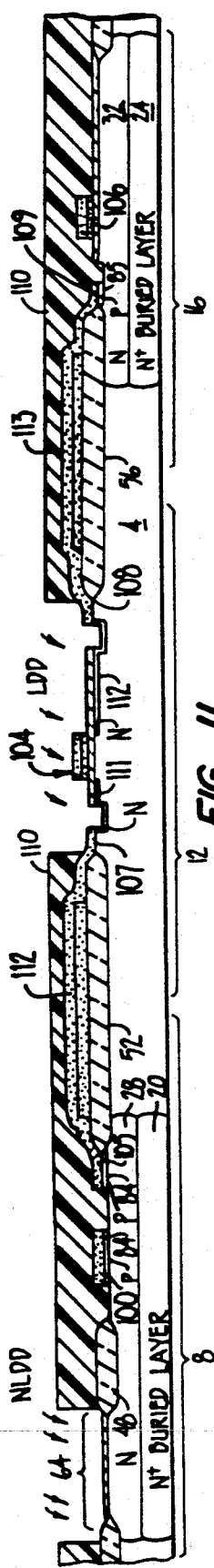
FIG._11.
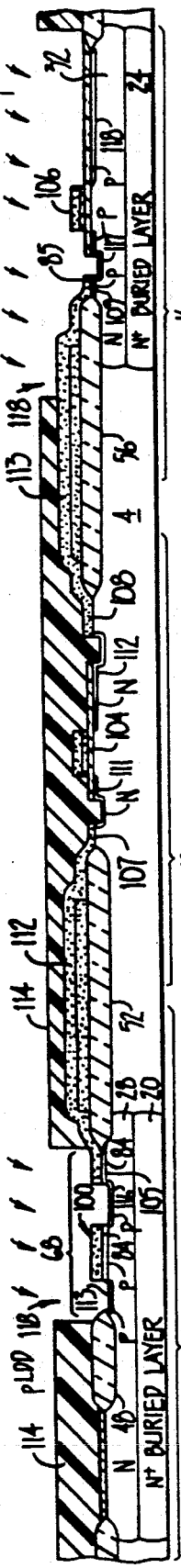
FIG._12.
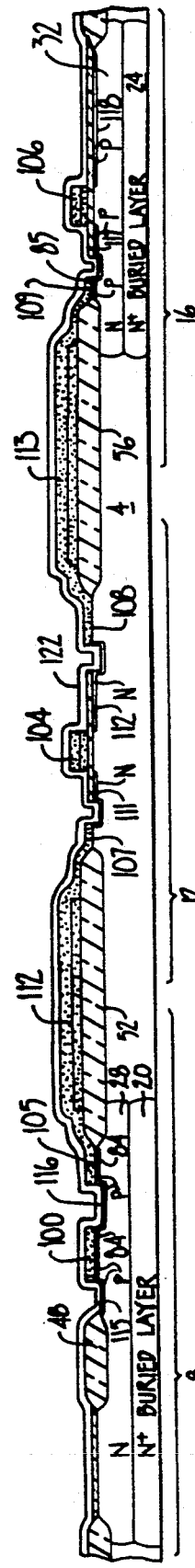
FIG._13.
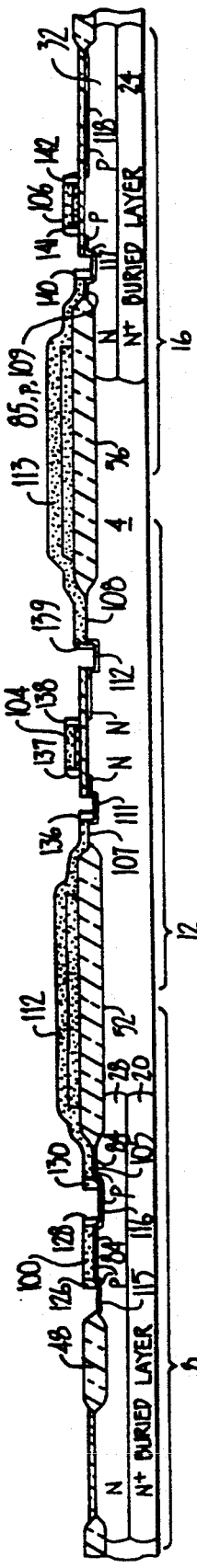
FIG._14.

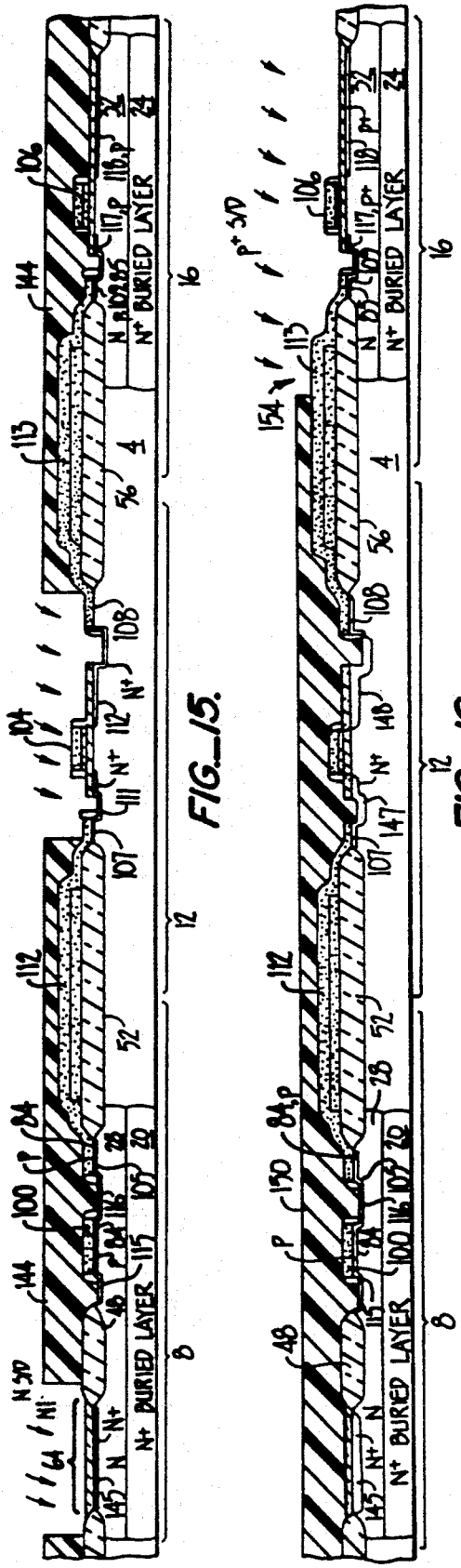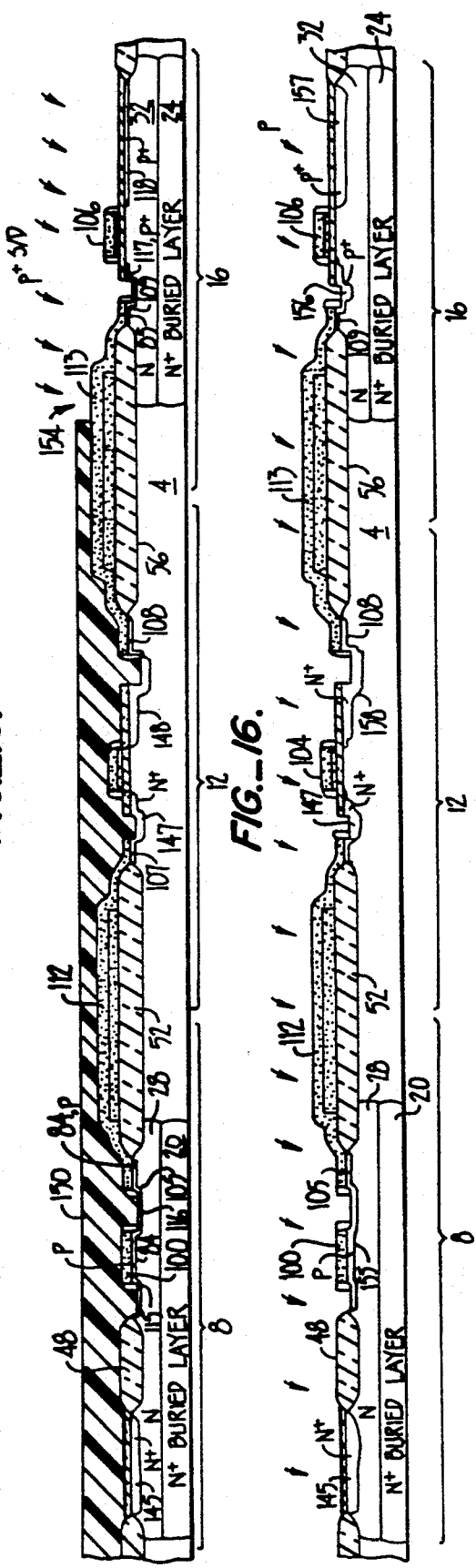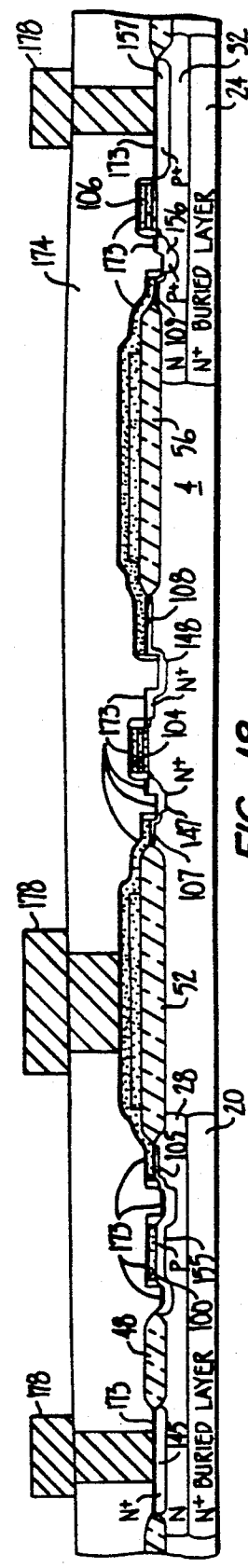

USE OF POLYSILICON LAYER FOR LOCAL INTERCONNECT IN A CMOS OR BICMOS TECHNOLOGY INCORPORATING SIDEWALL SPACERS

This is a Division of application Ser. No. 07/356,907, now abandoned filed May 24, 1989.

BACKGROUND OF THE INVENTION

1. Field Of The Invention

This invention relates to semiconductor devices and, more particularly, to the use of a polysilicon layer for local interconnect in a CMOS technology incorporating silicon dioxide sidewall spacers.

2. Description Of The Relevant Art

The use of a polysilicon layer for local interconnect has been reported in the literature for both bipolar and MOS technologies. In bipolar processes, a polysilicon layer can be used to electrically contact the base and collector regions of bipolar transistors. In MOS technologies, a polysilicon layer can be used to electrically contact the source-drain regions of the MOS transistors. The electrical contacts so formed are termed "buried contacts." By suitable patterning of the polysilicon layer forming the buried contacts, a local interconnect may be formed. Global interconnects then are formed by contacting the polysilicon layer using conventional metal interconnects.

In the past, local interconnects were formed using metal interconnects. Since the number of metal layers which may be formed on a given portion of a wafer is limited, the use of a polysilicon layer for local interconnect allows the metal layer that was formerly used for local interconnect to be employed as an additional global interconnect layer. In addition to the advantages in layout provided by an additional global interconnect layer, the use of a polysilicon layer to form device contacts also results in an improvement in transistor performance through reduction in device parasitic areas (e.g., the extrinsic base area in bipolar transistors). It also results in simplification of contact etch technology for shallow junctions where very high etch selectivity to the substrate is required. This is particularly important in processes where dielectric planarization is performed before contact etch, because contact may be made to the polysilicon layer rather than the shallow junction.

Known devices which use a polysilicon layer for local interconnect do not employ silicon dioxide sidewall spacers on the polysilicon layer. For example. FIG. 1 shows a semiconductor structure 1 wherein a polysilicon layer 2 forms a buried contact 3 to an active region 5. Structure 1 is silicided so that a silicide layer 6 extends over the top and sides of polysilicon layer 2 and thereafter along the surface of active region 5. Consequently, a source or drain current $I_{S/D}$ flows primarily along the silicided surface 6 to the active region 5.

In advanced CMOS or BiCMOS processes having very high packing densities, oxide sidewall spacers 7 (FIG. 2) are essential to ensure electrical isolation between polysilicon layer 2 and the polysilicon layer forming the gate (not shown). However, any silicide layer 6 now formed is discontinuous because no silicide forms over the oxide sidewall spacers 7. Consequently, a source/drain current $I_{S/D}$ flowing along the silicide layer 6 on the upper surface of polysilicon layer 2 must flow through the buried contact 3 and into the active region 5, beneath the sidewall spacer 7, and thereafter back to the silicided portion 6 of the active region 5. Because current must cross the buried contact 3 between the polysilicon layer 2 and the active region 5, a high series resistance may result. This high series resistance can degrade the performance of the device below acceptable levels in many applications. As a natural result of this concern, the use of a polysilicon layer for local interconnect in the presence of sidewall spacers has been avoided.

Finally, known devices which use a polysilicon layer for local interconnect limit contacts to N-type active regions to avoid the additional steps required when processing a polysilicon layer with differently doped regions. This hinders the flexibility of the polysilicon interconnect scheme or eliminates it altogether.

SUMMARY OF THE INVENTION

The present invention is directed to the use of a polysilicon layer for local interconnects through buried contacts in a CMOS or BICMOS technology incorporating silicon dioxide sidewall spacers. Contrary to popular belief, acceptable device characteristics may be realized if the proper process steps are followed. For example, experiment has shown that, for a device constructed in accordance with the present invention, degradation in the transistor's DC characteristics can be less than 10% for NMOS transistors and negligibly small for PMOS transistors. Such degradation is very much offset by other advantages. For example, higher packing densities result from using buried contacts in the advanced CMOS or BiCMOS processes which employ sidewall spacers. The polysilicon layer has a current capability compatible with bipolar currents (e.g. 300 $\mu A$ for PMOS devices and b 1 1 mA for NMOS devices). and the use of a polysilicon layer for local interconnect allows the construction of an additional metal global interconnect layer. Finally, buried contacts to both n+ and p+ active areas may be formed in a BiCMOS process without any additional processing steps.

In one embodiment of the present invention directed to a BiCMOS process, a silicon substrate is divided into bipolar and MOS regions. A thin layer of gate oxide then is thermally grown on the silicon substrate. A thin layer of polysilicon is deposited on the gate oxide layer to protect the gate oxide layer during subsequent processing, and then both the thin polysilicon layer and the gate oxide layer are etched from the bipolar and MOS regions where the respective emitter and gates are to be formed and where buried contacts are to be made. A thick layer of polysilicon then is deposited on the bipolar and MOS regions of the silicon substrate, and the substrate is masked and etched for defining the bipolar emitter, the MOS gates, and the local interconnects. A conformal silicon dioxide layer is subsequently deposited and etched for forming oxide spacers on the sidewalls of the polysilicon layer. By selectively doping the polysilicon layer and exposed portions of the substrate, a continuous active region is formed beneath the polysilicon layer and the sidewall spacers.

These and other features and advantages of the invention will become apparent to those skilled in the art upon a reading of the following detailed description of the invention, which should be considered in conjunction with the accompanying drawings.

BRIEF DESCRIPTION OF THE DRAWINGS

FIGS. 3–18 illustrate the steps of forming a combination bipolar/CMOS device according to a particular embodiment of the present invention.

DETAILED DESCRIPTION OF THE PREFERRED EMBODIMENTS

Figure 1:
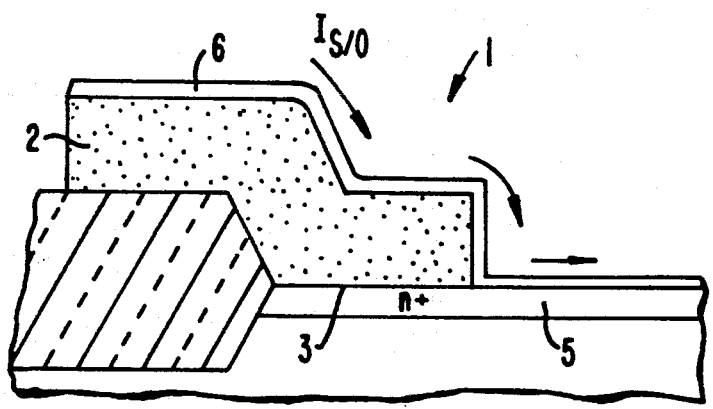
FIG. 1 is a diagram of a portion of a transistor showing current flow through a silicided polysilicon layer without an oxide sidewall spacer.
Figure 2:
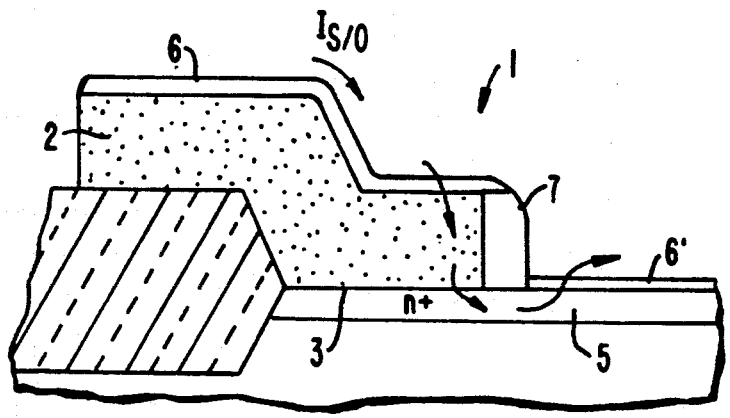
FIG. 2 is a diagram of a portion of a transistor showing current flow through a silicided polysilicon layer with an oxide sidewall spacer.

The description which follows is directed to one particular embodiment of the present invention suitable for a BiCMOS process. It should be understood however, that the present invention is not limited thereto and may be employed in any semiconductor fabrication process where low contact series resistance is desired.

FIG. 3 shows a silicon substrate 4 after having undergone preliminary processing according to conventional methods. For example, silicon substrate 4 has been processed to form a bipolar region 8, an NMOS region 12, and a PMOS region 16. Bipolar region 8 is intended to be used for forming an NPN transistor, whereas NMOS region 12 is intended to be used for forming an N-channel MOS device, and PMOS region 16 is intended to be used for forming a P-channel MOS device. If desired, bipolar region 8 may be used to form a PNP device by interchanging the conductivity type of the substrate dopants.

Silicon substrate 4 is formed of a P-type material. Consequently, bipolar region 8 and PMOS region 16 have formed therein arsenic doped N+ buried layers 20 and 24, respectively. N+ buried layers 20 and 24 may be formed, for example, by the process disclosed in U.S. Pat. No. 3,648,125 to Douglas L. Peltzer. Formed above N+ buried layers 20 and 24 are N-wells 28 and 32, respectively, formed by diffusion of an appropriate N-type impurity, such as phosphorous, into substrate 4 according to well known techniques. N+ buried layers 20 and 24 typically have an impurity concentration of approximately $1 \times 10^{20}$ atoms/cm$^3$ and are approximately 1 $\mu$m thick whereas N-wells 28 and 32 typically have an impurity concentration of approximately $1 \times 10^{16}$ atoms/cm$^3$ and a thickness of approximately 0.8 $\mu$m.

Disposed above substrate 4 are a layer of silicon dioxide 36 and a layer of silicon nitride 40. Silicon dioxide layer 36 preferably is thermally grown on the surface of substrate 4 by placing substrate 4 in an oxygen or steam, preferably steam, environment at a temperature of approximately 900° C. for 30 minutes. Silicon dioxide layer 36 has a thickness in the range of from approximately 350 Å to 450 Å, preferably 400 Å. Silicon nitride layer 40 may be deposited on top of silicon dioxide layer 36 by chemical vapor deposition (CVD). Silicon nitride layer 40 has a thickness in the range of from approximately 1500 Å to approximately 1700 Å, preferably 1600 Å.

Finally, a layer of photoresist 44 is deposited on silicon nitride layer 40 through a blanket coating, preferably by spinning, to a thickness of approximately 1.5 $\mu$m. The photoresist layer 44 is subjected to a pattern exposure so that development of the photoresist produces portions of photoresist layer 44, as shown in FIG. 4. These remaining portions of photoresist layer 44 function as a mask to enable etching of the layer 40 of silicon nitride in the areas not protected by the remaining portions of photoresist layer 44. This etching preferably is a dry etch with a plasma, such as SF$_6$. This produces the structure illustrated in FIG. 4.

After silicon nitride layer 40 is etched, the remaining portions of photoresist layer 44 are removed by a solvent or oxygen plasma, for example, and field oxide regions 48, 52, and 56 are formed by thermal oxidation in the presence of dry oxygen or steam as shown in FIG. 5. Preferably, the field oxide regions 48, 52, and 56 are formed by thermal oxidation in steam at a temperature of 900° C. to a thickness of from approximately 5000 Å to approximately 6000 Å, preferably 5500 Å. As a result, bipolar region 8 is electrically isolated from NMOS region 12 by field oxide region 52, and NMOS region 12 is electrically isolated from PMOS region 16 by field oxide region 56. Field oxide region 48 separates bipolar region 8 into a collector contact region 64 and a base/emitter region 68.

After formation of the field oxide regions 48, 52, and 56, the remaining portions of silicon nitride layer 40 and silicon dioxide layer 36 are removed to produce the structure shown in FIG. 6. The portions of silicon nitride layer 40 may be removed by wet etching in orthophosphoric acid, and silicon dioxide layer 36 may be removed by wet etching in hydrofluoric acid.

As shown in FIG. 7, the next step is to form a thin layer of silicon dioxide 70 on the exposed surfaces of substrate 4. Silicon dioxide layer 70 is used to form the gate oxide for the MOS devices. In this embodiment, it has a thickness in the range of from approximately 150 Å to 300 Å, although the thickness range may vary depending on the desired operating characteristics of the MOS devices. Next, a thin polycrystalline silicon layer 72 is deposited as a blanket coating over the silicon dioxide layer 70 and the field oxide regions 48, 52, and 56. The polycrystalline silicon layer 72 is deposited by CVD, and it has a thickness of from approximately 500 Å to 1000 Å, preferably 700 Å. This thickness of polycrystalline silicon layer 72 has been found by experimentation to be desirable to protect silicon dioxide layer 70 from corruption during subsequent processing.

Next, as shown in FIG. 8, a photoresist layer 76 is deposited as a blanket coating over polycrystalline silicon layer 72 in the same manner as photoresist layer 44. After photoresist layer 76 is deposited, masked and developed, openings 80 are formed over base/emitter region 68 and over those regions where buried contacts to the silicon substrate are desired. With the remaining portions of photoresist layer 76 functioning as a mask, the exposed sections of polycrystalline silicon layer 72 are removed by a dry etch. Then, the exposed portions of gate oxide layer 70 are ion-implanted with a P-type impurity. This P-type implant creates a P-implant area 84 in N-well 28 of bipolar region 8 which will ultimately form the intrinsic base of the bipolar device. A P-implant area 85 forms in the exposed portion of PMOS region 16. On the other hand, the P-type implant has a negligible effect on the P-type substrate beneath the two exposed regions in NMOS region 12. The exposed portions of gate oxide layer 70 are then removed through a buffered oxide etch while maintaining photoresist layer 76 as a mask.

Next, as shown in FIG. 9, photoresist layer 76 is removed, and a relatively thick polycrystalline silicon layer 74 is deposited as a blanket coating by CVD over the remaining portions of polycrystalline silicon layer 72 and the exposed areas of silicon substrate 4. Polycrystalline silicon layer 74 is substantially thicker than polycrystalline silicon layer 72, and preferably has a thickness of from approximately 2000 Å to 4000 Å. Next, a layer of photoresist 77 is deposited and developed to form openings 88 over base/emitter region 68, defining an emitter region, and over NMOS region 12. Polycrystalline silicon layer 74 then is doped by an N-type impurity, such as arsenic, and the ions are implanted with sufficient implant energy to a concentration of from approximately $1 \times 10^{15}$ to $1 \times 10^{16}$ atoms/cm$^2$. The remaining portions of photoresist layer 77 are removed, and the structure is then annealed at a temperature of from approximately 900° C. to 950° C. for approximately 30 minutes in a nitrogen atmosphere to diffuse the dopant through the implanted portion of polycrystalline silicon layer 74.

Next, as shown in FIG. 10, a photoresist layer 96 is deposited over polysilicon layer 74. Photoresist layer 96 is masked and developed to expose all areas of polysilicon layer 74, except over a region which will form the emitter 100 of the bipolar device, over a region which will form the gate 104 of the NMOS device, over a region which will form the gate 106 of the PMOS device, and over the regions of polysilicon layer 74 where buried contacts 105, 107, 108 and 109 to the silicon substrate and local interconnects 112, 113 are to be made, e.g., over field oxide regions 52 and 56. The exposed portions of polysilicon layer 74 then are overetched by a plasma until the exposed portions of polysilicon are removed. Since some areas of polysilicon comprise polysilicon layers 72 and 74, whereas other areas of polysilicon comprise only polysilicon layer 74, portions of substrate 4 not protected by gate oxide layer 70 are overetched to a depth approximately equal to that of the thin polysilicon layer 72. This occurs, e.g., in base/emitter region 68 and forms an emitter island 108. Consequently, the thickness of polysilicon layers 72 and 74 forming NMOS gate 104 and PMOS gate 106 is the same as the depth of the polysilicon layer 74 and emitter island 108 forming emitter 100. The small thickness of polysilicon layer 72 ensures that the subsequently formed base region in bipolar region 8 is not so deep as to adversely affect the breakdown voltage of the bipolar device. The effect of the overetching on the MOS devices will be discussed later.

Next, as shown in FIG. 11, photoresist layer 96 is removed, and a photoresist layer 110 is deposited over substrate 4 everywhere except collector contact region 64 and NMOS region 12. Then, an N-type lightly doped drain (LDD) implant is performed with phosphorous ions on the exposed regions with an implantation energy of 40 KeV to a concentration of from approximately $1 \times 10^{13}$ to $1 \times 10^{14}$ atoms/cm$^2$. This forms N-implant areas 111 and 112 and lightly dopes the polysilicon gate 104 and buried contacts 107, 108 in NMOS region 12. The collector contact region 64 also is lightly doped at this time.

Next, as shown in FIG. 12, photoresist layer 110 is removed, and a photoresist layer 114 is deposited over substrate 4. Photoresist layer 114 then is developed to form openings 118 over base/emitter region 68 and PMOS region 16. Then, a P-type implant is performed (the LDD implant for PMOS region 16 and the link implant for base/emitter region 68), preferably with boron difluoride at an implantation energy of 50 KeV to a concentration of from approximately $1 \times 10^{13}$ to $1 \times 10^{14}$. This forms P-implant areas 115 and 116 in base/emitter region 68 (adjacent the remaining portions of P-implant area 84), and P-implant areas 117, 118 in PMOS region 16. Because of the low concentration of the P-type dopant, the N-type emitter 100 is not counter doped. Thereafter, photoresist layer 114 is removed.

Next, as shown in FIG. 13, a conformal silicon dioxide layer 122 is deposited by CVD over the entire surface of substrate 4 to a thickness of from approximately 1500 to 4000 Å, preferably 2000 Å. Silicon dioxide layer 122 then is subjected to an LTO densification by heating at approximately 900° C. for approximately 15 minutes.

Then, as shown in FIG. 14, silicon dioxide layer 122 is subjected to an anisotropic etch, preferably in a plasma comprising He.C$_2$F$_6$.CHF$_3$ to form spacers 126, 128, 130, 136, 137, 138, 139, 140, 141, and 142.

In the next step, shown in FIG. 15, a photoresist mask 144, similar to photoresist mask 110 (FIG. 11), is deposited and developed to expose collector contact region 64 and NMOS region 12. An N-type ion implant then is performed, preferably with arsenic, at an implantation energy of 100 KeV to a concentration of approximately $5 \times 10^{15}$ atoms/cm$^2$ to heavily dope N-implant areas 111 and 112 for forming the source and drain regions of the NMOS device, and to form a heavily doped N-implant area 145 in the collector contact region 64 of the bipolar device. Afterwards, substrate 4 is annealed at a temperature of 900° C. for approximately 30 minutes to form an N+ collector contact junction 146 in bipolar region 8 (FIG. 16), and a contiguous N+ source region 147 and N+ drain region 148 in NMOS region 12.

Similarly, as shown in FIG. 16, a photoresist layer 150 is deposited and developed to form an opening 154 over PMOS region 16, and then a P-type ion implant is performed with boron difluoride at an implantation energy of 50 KeV to a concentration of approximately $3 \times 10^{15}$ atoms/cm$^2$ to heavily dope P-implant areas 117 and 118 for creating the source and drain of the PMOS device. Then, as shown in FIG. 17, photoresist layer 150 is removed and a final blanket, unmasked P-type implant with BF$_2$ at an implantation energy of 50 KeV to a concentration of $1 \times 10^{14}$ atoms/cm$^2$ is performed for ultimately forming the extrinsic base of the bipolar device. Substrate 4 then is annealed at a temperature of 900° for approximately 40 minutes to form a contiguous base 155 in bipolar region 8, and P+ source 156 and P+ drain 157 in PMOS region 16.

Figure 19:
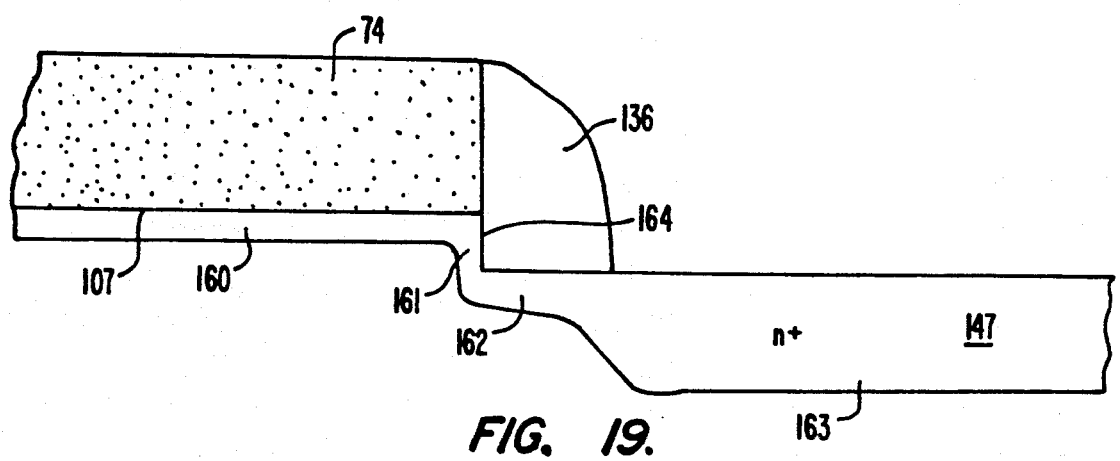
FIG. 19 is a diagram of a substrate junction formed beneath a polysilicon layer forming a buried contact and its associated oxide sidewall spacer according to a particular embodiment of the present invention.

FIG. 19 is a diagram of a substrate junction formed beneath a polysilicon layer forming a buried contact and its associated sidewall spacer according to the foregoing embodiment of the present invention. For purposes of example, FIG. 19 is a cross-sectional view of buried contact 107 to source region 147 in NMOS region 12. Region 147 comprises contiguous regions 160, 161, 162 and 163. Shallow region 160 is formed by out diffusion of the N-type ions previously implanted in polysilicon layer 74. Shallow region 161 is formed as a result of the LDD implant into substrate wall 164 (especially if the implant is done at an angle), and/or from dopant diffusion along the silicon/oxide interface from ions implanted in the adjacent polysilicon layer 74 together with the ions from the LDD implant. Shallow region 162 is formed by diffusion of implant area 111 (FIG. 15) from the LDD implant. Region 163 is formed by diffusion of the source/drain implant. To minimize series resistance, each region should combine to form a continuous substrate junction (i.e., region 147). In the absence of LDD implants, the implanted dopants in the polysilicon and substrate must diffuse laterally in order to form continuous substrate junctions. Therefore, the extent of that lateral diffusion as determined by the anneal schedule and the doping parameters such as implant energy should be varied as the application requires.

The amount of silicon overetch caused by the gate/emitter etch can have a significant effect on the resulting buried contact series resistance. Region 161, which is created as a result of the overetching, is a high resistance current path because it is very shallow and its doping ordinarily is light. Thus, depending upon a given application, the process parameters must be varied to ensure that the effects of the high resistance current path are compensated for (e.g. by ensuring adequate lateral diffusion of N-implant area 111 (FIG. 15) and outdiffusion from polysilicon layer 74 into substrate 4 during the source/drain anneal.

Finally, as shown in FIG. 18, the exposed silicon and polysilicon regions are silicided using well known techniques to form silicide layers 173. The substrate 4 is covered with a planarizing layer 174 of deposited oxide using well known techniques, such as LTO. Planarizing layer 174 then is etched, and metal contacts 178 are made directly to the polysilicon interconnect layer and, if desired, to the active device regions, also using well known techniques. If all contacts are made to the polysilicon layer, then the contact etch technology is simplified by not having to make contact to shallow active regions.

Two independent experiments were carried out to investigate the characteristics of devices which use the polysilicon gate layer for local interconnect in a CMOS process according to the present invention. The first experiment was directed to the effect of the source-drain anneal schedule on the buried contact series resistance. Measurements of the buried contact total series resistance versus the anneal schedule of the N-type and P-type contacts are summarized in Table 1.

TABLE 1

Buried Contact Resistance Versus Anneal Schedule
(Area equals 2.0 $\mu m^2$/contact and perimeter equals 5.0 $\mu m$/contact)

| Anneal Time/Temperature | N-type ohms/contact | P-type ohms/contact |
|---|---|---|
| 45 min @ 900° C. | 150–900 | 270 ± 58 |
| 60 min @ 900° C. | 140–420 | 255 ± 48 |
| 30 min @ 950° C. | 92 ± 25 | 166 ± 23 |

The measurements were obtained from a test structure that consisted of a chain of 200 5-$\mu m$ perimeter (2.0 $\mu m^2$ area) buried contacts. The sample size for each measurement in Table 1 is 176 (taken from four wafers in each split). The measurements for the N-type contacts show that an anneal cycle equivalent to 30 minutes at 950° C. is required for the arsenic to diffuse vertically through the polysilicon layer to the substrate to form a low and consistent buried contact resistance. The corresponding anneal time for P-type buried contacts is much smaller, however, due to the faster diffusion of boron in polysilicon.

In the second experiment, NMOS and PMOS transistors with conventional contacts and buried contacts according to the present invention were fabricated. The anneal time for P-type contacts was 40 minutes at 900° C., and the anneal time for N-type contacts was 70 minutes at 950° C. The overall buried contact resistance measured on a contact chain similar to the chain used in the first experiment (200 contacts in series) but with an effective perimeter of 3.2 $\mu m$ per contact was found to be approximately 150 ohms per contact for N-type buried contacts and approximately 200 ohms per contact for P-type contacts. The components of the buried contact series resistance were also measured using a modified Kelvin test structure wherein the polysilicon layer and the active region cross over to form a buried contact with an effective perimeter of 3.2 $\mu m$. The results for both types of contacts confirmed that the major component (more than 90%) of the buried contact resistance is caused by the shallow junction under the oxide spacers.

Figure 20:
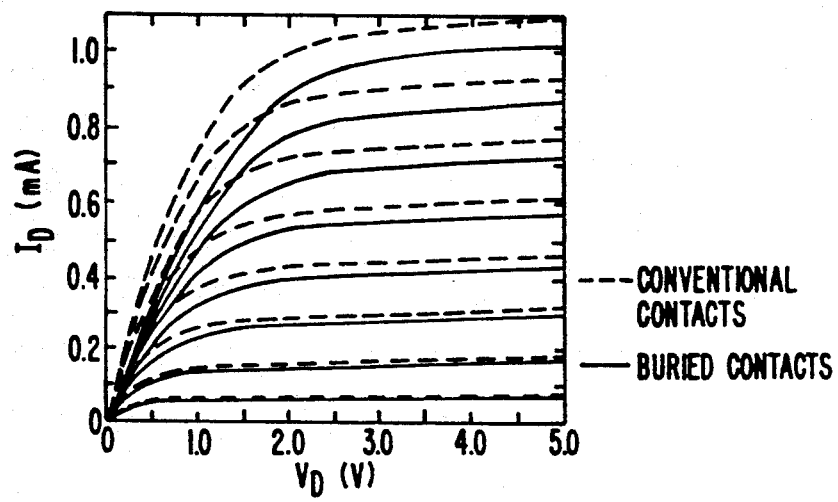
FIG. 20 is a graph showing a comparison between conventional and buried contact transistor characteristics for an NMOS device constructed according to a particular embodiment of the present invention.
Figure 21:
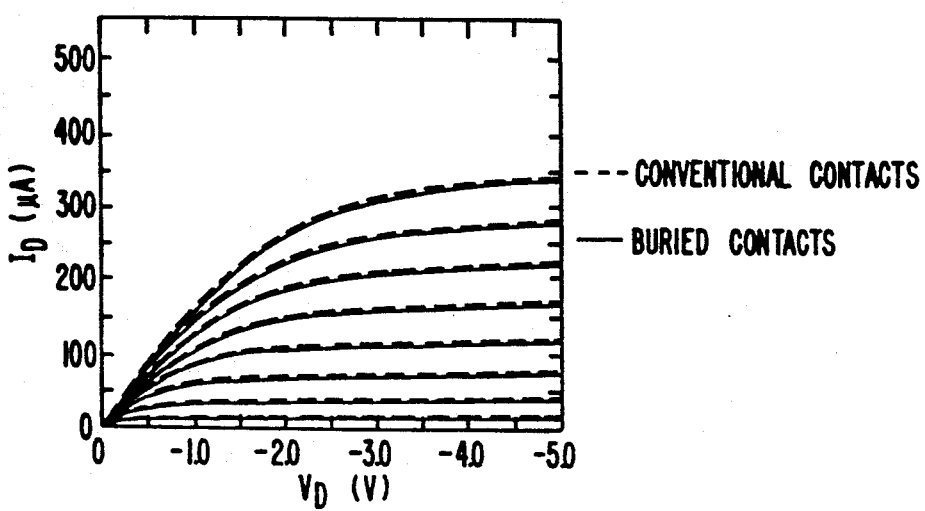
FIG. 21 is a graph showing a comparison between conventional and buried contact transistor characteristics for a PMOS device constructed according to a particular embodiment of the present invention.

The resulting NMOS and PMOS transistor characteristics are shown in FIGS. 20 and 21, respectively, with both conventional and buried contacts taken from transistors on the same dye. The NMOS transistors in FIG. 20 have $W_{eff}/L_{eff}=3.2/1.0$ $\mu m$ whereas the PMOS transistors in FIG. 21 have $W_{eff}/L_{eff}=3.2/1.1$ $\mu m$. The additional buried contact series resistance resulted in a reduction in the NMOS linear peak gain (A/V$^2$) of approximately 9% and a reduction in drain saturation current $V_{ds}=V_{gs}=5.0$ volts) of approximately 6%. The corresponding reduction in PMOS DC characteristics was less than 2%. The higher degradation in NMOS characteristics is due to its lower channel resistance. In wider transistors, similar degradation will be obtained since both the channel and the buried contact resistance scale proportionately.

Figure 22:
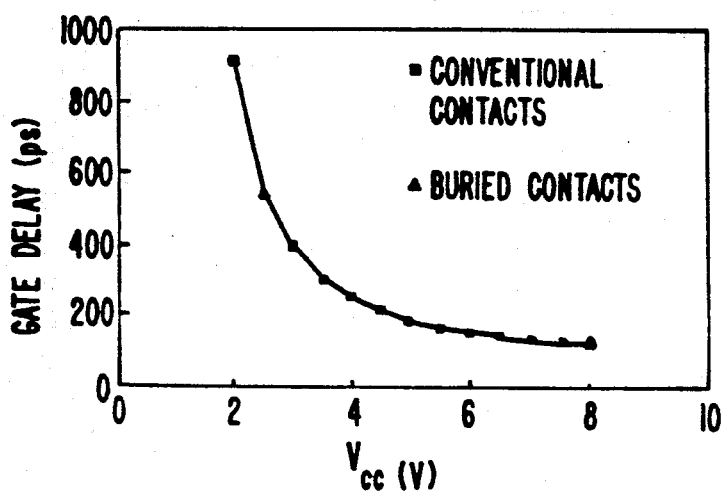
FIG. 22 is a graph showing measured gate delay in two CMOS ring oscillators; one constructed with conventional contacts, and the other constructed with buried contacts according to a particular embodiment of the present invention.

In another experiment, the effect of the buried contact series resistance on propagation delay was demonstrated by measuring the speed of two CMOS ring oscillators (Fan In=Fan Out=1, load capacitance approximately equal to 0.07 pf per stage), one with buried contacts and the other with conventional contacts. Both rings consisted of 101 inverter stages with $W/L_{eff}=15/1.0$ $\mu m$ and 20/1.1 $\mu m$ for the NMOS and PMOS transistors, respectively. The resulting gate delays versus supply voltage, shown in FIG. 22, indicate that the additional buried contact resistance had a negligible effect on the propagation delay for circuits with low nodal capacitance.

The foregoing description shows that buried contacts to both N-type and P-type active regions are possible, and that the local interconnect scheme may be employed with no additional costs in a BiCMOS process, since the interconnects are formed by the mask which forms the buried contacts themselves. All the steps required to form the local interconnects are part of the general process. An additional advantage in using buried contacts as a local interconnect layer according to the present invention is the capability of flowing large currents through the local interconnect since the current need not flow solely through the silicide layer. Furthermore, buried contacts require substantially less overhead (e.g., the distance between the metal contact contacting the active region and the field oxide regions), and therefore they significantly offset the increase in contact resistance as well.

While the above is a detailed description of one embodiment of the present invention, various modifications may be employed. For example, the foregoing techniques may be used to construct PMOS and NMOS devices by themselves, and CMOS devices without bipolar devices. Consequently, the scope of the invention should not be limited, except as described in the claims.

We claim:

1. A method of constructing portions of a metal oxide semiconductor structure comprising the steps of, in sequence,:
   depositing a polysilicon layer contacting a semiconductor substrate;
   implanting the polysilicon layer with a first conductivity type impurity;
   etching the polysilicon layer for forming a buried contact to the substrate with the polysilicon layer and for exposing portions of the substrate adjacent to the buried contact;
   lightly doping exposed portions of the substrate adjacent to the buried contact by implanting the substrate with the first conductivity type impurity;
   forming a nonconductive oxide spacer on a sidewall of the polysilicon layer and contacting the substrate;
   heavily doping the substrate for later forming one of a source or drain region by implanting the substrate with the first conductivity type impurity adjacent to the oxide spacer; and
   heating the substrate for forming the source or drain region adjacent to the oxide spacer and for forming a continuous first conductivity type region directly beneath the polysilicon layer and the oxide spacer, the continuous first conductivity type region contacting the formed source or drain region.

2. The method according to claim 1 further comprising the steps of:
   prior to the substrate implanting step performed prior to the oxide spacer forming step, etching the substrate so that a portion of the substrate adjacent the buried contact is lower than a portion of the substrate beneath the buried contact and defines a generally vertical substrate wall; and
   wherein the heating step further comprises the step of heating the substrate so that a continuous first conductivity-type region is formed beneath the polysilicon layer, along the substrate wall, and beneath the oxide spacer.

3. The method according to claim 2 wherein the heating step further comprises the step of heating the substrate so that the portion of the first conductivity-type region beneath the polysilicon layer is formed by out diffusion of the first conductivity-type impurity from the polysilicon layer.

4. The method according to claim 3 wherein the heating step further comprises the step of heating the substrate so that the portion of the first conductivity-type region along the substrate wall is formed by diffusion of the first conductivity-type impurity implanted in the substrate prior to the oxide spacer forming step.

5. The method according to claim 4 wherein the substrate implanting step prior to the oxide spacer forming step further comprises the step of tilting the substrate for increasing the amount of first conductivity-type impurity implanted in the substrate wall.

6. The method according to claim 5 wherein the polysilicon layer depositing step further comprises the step of depositing the polysilicon layer to a thickness of from approximately 2000 Å to approximately 4000 Å.

7. The method according to claim 6 wherein the oxide spacer forming step further comprises the steps of:
   depositing a conformal silicon dioxide layer to a thickness of from approximately 1500 Å to approximately 4000 Å; and
   anisotropically etching the conformal silicon dioxide layer for forming the oxide spacer.

8. The method according to claim 7 wherein the heating step further comprises the step of heating the semiconductor structure at a temperature of approximately 900° C. for approximately 30 to 40 minutes.

9. The method according to claim 8 wherein the conformal silicon dioxide layer depositing step further comprises the step of depositing the conformal silicon dioxide layer to a thickness of approximately 2000 Å.

10. A method of constructing a semiconductor structure comprising the steps of:
   forming a bipolar region in a silicon substrate for a bipolar device, the bipolar region having a first region, termed a collector region, and a second region, the first and second regions being separated by a first field oxide region:
   forming a MOS region in the silicon substrate for a MOS device, the MOS region being separated from the bipolar region by a second field oxide region;
   growing a thin oxide layer on the bipolar region and on the MOS region;
   depositing a thin polysilicon layer over the thin oxide layer in the bipolar region and in the MOS region;
   removing the thin polysilicon layer and the thin oxide layer from the second region and from regions of the substrate where first and second buried contacts to the substrate are to be made;
   depositing a thick polysilicon layer on the bipolar region and on the MOS region;
   masking a portion of the thick polysilicon layer in the second region for defining an emitter;
   masking a portion of the thick polysilicon layer in the MOS region for defining a gate;
   masking portions of the thick polysilicon layer for defining the first and second interconnected buried contacts to the substrate;
   etching the polysilicon in the bipolar and MOS regions for forming an emitter of a bipolar device, a gate of an MOS device, and first and second interconnected polysilicon buried contacts to the substrate;
   doping the portion of the polysilicon forming the first buried contact with a first impurity;
   doping the portion of the substrate adjacent to the first buried contact with the first impurity;
   doping the portion of the polysilicon forming the second buried contact with a second impurity;
   doping the portion of the substrate adjacent to the second buried contact with the second impurity;

forming a first oxide spacer on a sidewall of the portion of the polysilicon forming the first buried contact;

forming a second oxide spacer on a sidewall of the portion of the polysilicon forming the second buried contact; and heating the substrate so that a continuous first impurity-doped region is formed beneath the first buried contact and the first oxide spacer, and so that a continuous second impurity doped region is formed beneath the second buried contact and the second oxide spacer.

11. The method according to claim 10 wherein the first and second impurities have the same conductivity type.

12. The method according to claim 10 wherein the first and second impurities have different conductivity types.

13. The method according to claim 10 wherein the step of doping the portion of the substrate adjacent to the first buried contact is performed after the first oxide spacer forming step.

14. The method according to claim 13 further comprising the steps of:

prior to the first spacer forming step, etching the portion of the substrate adjacent to the first buried contact to a level below the portion of the substrate beneath the first buried contact for defining a first generally vertical substrate wall;

thereafter, and prior to the first spacer forming step, implanting the substrate with the first impurity; and wherein the substrate heating step further comprises the step of heating the substrate so that a continuous first impurity-doped region is formed beneath the first buried contact, adjacent the first substrate wall, and beneath the first oxide spacer.

15. The method according to claim 14 wherein the heating step further comprises the step of heating the substrate so that the portion of the first impurity-doped region beneath the buried contact is formed by out-diffusion of the first impurity from the thick polysilicon layer.

16. The method according to claim 15 wherein the heating step further comprises the step of heating the substrate so that the portion of the first impurity-doped region adjacent the substrate wall is formed by diffusion of the first impurity implanted in the substrate prior to the first spacer forming step.

17. The method according to claim 16 wherein the substrate implanting step performed prior to the first spacer forming step further comprises the step of tilting the substrate for increasing the amount of first impurity implanted in the first substrate wall.

18. A method of constructing a semiconductor structure comprising the steps of:

forming a first MOS region in a silicon substrate for a first channel type MOS device;

forming a second MOS region in the silicon substrate for a second channel type MOS device, the second MOS region being separated from the first MOS region by a field oxide region;

growing a thin oxide layer on the first and second MOS regions;

depositing a thin polysilicon layer over the thin oxide layer in the first and second MOS regions;

removing the thin polysilicon layer and the thin oxide layer from regions of the substrate where first and second buried contacts to the substrate are to be made;

depositing a thick polysilicon layer on the first and second MOS regions;

masking a portion of the thick polysilicon layer in the first MOS region for defining a first gate;

masking a portion of the thick polysilicon layer in the second MOS region for defining a second gate;

masking portions of the thick polysilicon layer for defining first and second interconnected buried contacts to the substrate;

etching the polysilicon in the first and second MOS regions for forming corresponding first and second gates for the first and second MOS devices, and first and second interconnected polysilicon buried contacts to the substrate;

doping the portion of the polysilicon forming the first buried contact with a first impurity;

doping the portion of the substrate adjacent to the first buried contact with the first impurity;

doping the portion of the polysilicon forming the second buried contact with a second impurity;

doping the portion of the substrate adjacent to the second buried contact with the second impurity;

forming a first oxide spacer on a sidewall of the portion of the polysilicon forming the first buried contact;

forming a second oxide spacer on a sidewall of the portion of the polysilicon forming the second buried contact; and heating the substrate so that a continuous first impurity-doped region is formed beneath the first buried contact and the first oxide spacer, and so that a continuous second impurity doped region is formed beneath the second buried contact and the second oxide spacer.

19. The method according to claim 18 wherein the first and second impurities have the same conductivity type.

20. The method according to claim 18 wherein the first and second impurities have different conductivity types.

21. The method according to claim 18 wherein the step of doping the portion of the substrate adjacent to the first buried contact is performed after the first oxide spacer forming step.

22. The method according to claim 21 further comprising the steps of:

prior to the first spacer forming step, etching the portion of the substrate adjacent to the first buried contact to a level below the portion of the substrate beneath the first buried contact for defining a first generally vertical substrate wall;

thereafter, and prior to the first spacer forming step, implanting the substrate with the first impurity; and wherein the substrate heating step further comprises the step of heating the substrate so that a continuous first impurity-doped region is formed beneath the first buried contact, adjacent the first substrate wall, and beneath the first oxide spacer.

23. The method according to claim 22 wherein the heating step further comprises the step of heating the substrate so that the portion of the first impurity-doped region beneath the buried contact is formed by out-diffusion of the first impurity from the thick polysilicon layer.

24. The method according to claim 23 wherein the heating step further comprises the step of heating the substrate so that the portion of the first impurity-doped region adjacent the substrate wall is formed by diffusion of the first impurity implanted in the substrate prior to the first spacer forming step.

25. The method according to claim 24 wherein the substrate implanting step performed prior to the first spacer forming step further comprises the step of tilting the substrate for increasing the amount of first impurity implanted in the first substrate wall.

26. A method of constructing a semiconductor structure comprising the steps of:
forming a bipolar region in a silicon substrate for a bipolar device, the bipolar region having a first region, termed a collector region, and a second region, the first and second regions being separated by a first field oxide region;
forming a first MOS region in the silicon substrate for a first channel type MOS device, the first MOS region being separated from the bipolar region by a second field oxide region;
forming a second MOS region in the silicon substrate for a second channel type MOS device, the second MOS region being separated from the first MOS region by a third field oxide region;
growing a thin oxide layer on the bipolar region and on the first and second MOS regions;
depositing a thin polysilicon layer over the thin oxide layer in the bipolar region and in the first and second MOS regions;
removing the thin polysilicon layer and the thin oxide layer from the second region and from regions of the substrate where first and second buried contacts to the substrate are to be made;
depositing a thick polysilicon layer on the bipolar region and on the first and second MOS regions;
masking a portion of the thick polysilicon layer in the second region for defining an emitter;
masking a portion of the thick polysilicon layer in the first MOS region for defining a first gate;
masking a portion of the thick polysilicon layer in the second MOS region for defining a second gate;
masking portions of the thick polysilicon layer for defining first and second interconnected buried contacts to the substrate;
etching the polysilicon in the bipolar and first and second MOS regions for forming an emitter of a bipolar device, a first gate for the first MOS device, a second gate for the second MOS device, and first and second interconnected polysilicon buried contacts to the substrate;
doping the portion of the polysilicon forming the first buried contact with a first impurity;
doping the portion of the substrate adjacent to the first buried contact with the first impurity;
doping the portion of the polysilicon forming the second buried contact with a second impurity;
doping the portion of the substrate adjacent to the second buried contact with the second impurity;
forming a first oxide spacer on a sidewall of the portion of the polysilicon forming the first buried contact;
forming a second oxide spacer on a sidewall of the portion of the polysilicon forming the second buried contact; and
heating the substrate so that a continuous first impurity-doped region is formed beneath the first buried contact and the first oxide spacer, and so that a continuous second impuity-doped region is formed beneath the second buried contact and the second oxide spacer.

27. The method according to claim 26 wherein the first and second impurities have the same conductivity type.

28. The method according to claim 26 wherein the first and second impurities have different conductivity types.

29. The method according to claim 26 wherein the step of doping the portion of the substrate adjacent to the first buried contact is performed after the first oxide spacer forming step.

30. The method according to claim 29 further comprising the steps of:
prior to the first spacer forming step, etching the portion of the substrate adjacent to the first buried contact to a level below the portion of the substrate beneath the first buried contact for defining a first generally vertical substrate wall;
thereafter, the prior to the first spacer forming step, implanting the substrate with the first impurity; and
wherein the substrate heating step further comprises the step of heating the substrate so that a continuous buried contact, adjacent the first substrate wall, and beneath the first oxide spacer.

31. The method according to claim 29 wherein the heating step further comprises the step of heating the substrate so that the portion of the first impurity-doped region beneath the buried contact is formed by out-diffusion of the first impurity from the thick polysilicon layer.

32. The method according to claim 31 wherein the heating step further comprises the step of heating the substrate so that the portion of the first impurity-doped region adjacent the substrate wall is formed by diffusion of the first impurity implanted in the substrate prior to the first spacer forming step.

33. The method according to claim 32 wherein the substrate implanting step performed prior to the first spacer forming step further comprises the step of tilting the substrate for increasing the amount of first impurity implanted in the first substrate wall.

34. The method according to claim 1 wherein the polysilicon layer implanting step comprises the step of implanting the polysilicon layer with the first conductivity type impurity to a concentration of from approximately $1 \times 10^{15}$ to approximately $1 \times 10^{16}$ atoms/cm$^2$.

35. The method according to claim 1 wherein the substrate implanting step performed prior to the oxide spacer forming step comprises the step of implanting the substrate with the first conductivity type impurity to a concentration of approximately $1 \times 10^{13}$ to approximately $1 \times 10^{14}$ atoms/cm$^2$.

36. The method according to claim 1 wherein the substrate implanting step performed after the oxide spacer forming step comprises the step of implanting the substrate with the first conductivity type impurity to a concentration of approximately $5 \times 10^{15}$ atoms/cm$^2$.

37. The method according to claim 1 wherein the polysilicon layer implanting step comprises the step of implanting the polysilicon layer with arsenic to a concentration of approximately $1 \times 10^{15}$ to approximately $1 \times 10^{16}$ atoms/cm$^2$, wherein the substrate implanting step performed prior to the oxide spacer forming step comprises the step of implanting the substrate with phosphorous to a concentration of approximately $1 \times 10^{13}$ to $1 \times 10^{14}$ atoms/cm$^2$, and wherein the substrate implanting step performed after the oxide spacer forming step comprises the step of implanting the substrate with arsenic to a concentration of approximately $5 \times 10^{15}$ atoms/cm$^2$.

38. The method according to claim 1 wherein the step of implanting the substrate performed after the oxide spacer forming step comprises the step of implanting the substrate with the first conductivity type impurity for forming one of a source region or a drain region of the semiconductor structure.

* * * * *